(12) United States Patent
Ikeda et al.

(10) Patent No.: US 11,362,241 B2
(45) Date of Patent: Jun. 14, 2022

(54) LIGHT EMITTING DEVICE

(71) Applicant: NICHIA CORPORATION, Anan (JP)

(72) Inventors: Tadaaki Ikeda, Anan (JP); Yukiko Yokote, Anan (JP)

(73) Assignee: NICHIA CORPORATION, Anan (JP)

(*) Notice: Subject to any disclaimer, the term of this patent is extended or adjusted under 35 U.S.C. 154(b) by 91 days.

(21) Appl. No.: 17/029,957

(22) Filed: Sep. 23, 2020

(65) Prior Publication Data
US 2021/0098663 A1 Apr. 1, 2021

(30) Foreign Application Priority Data

Sep. 27, 2019 (JP) .............................. JP2019-177033

(51) Int. Cl.
H01L 33/50 (2010.01)
H01L 33/48 (2010.01)
H01L 33/60 (2010.01)
H01L 33/62 (2010.01)
H01L 25/075 (2006.01)

(52) U.S. Cl.
CPC .......... *H01L 33/505* (2013.01); *H01L 33/486* (2013.01); *H01L 33/60* (2013.01); *H01L 33/62* (2013.01)

(58) Field of Classification Search
CPC . H01L 33/60; H01L 25/0756; H01L 25/0753; H01L 33/50; H01L 33/501; H01L 33/502; H01L 33/504; H01L 33/505
See application file for complete search history.

(56) References Cited

U.S. PATENT DOCUMENTS

| 2005/0110032 A1 | 5/2005 | Saito et al. |
| 2014/0299836 A1 | 10/2014 | Wu |
| 2019/0237634 A1* | 8/2019 | Nakabayashi .......... H01L 33/60 |

FOREIGN PATENT DOCUMENTS

| JP | 2000-244020 A | 9/2000 |
| JP | 2005-158795 A | 6/2005 |
| JP | 2006-173326 A | 6/2006 |
| JP | 3197983 U | 6/2015 |

* cited by examiner

Primary Examiner — Marcos D. Pizarro
Assistant Examiner — Antonio B Crite
(74) Attorney, Agent, or Firm — Foley & Lardner LLP

(57) ABSTRACT

A light emitting device includes a first light emitting element, a second light emitting element, a first light-transmissive member, and a first wavelength converting member. The first light emitting element has a first light emitting element first surface at which a first n-side electrode and a first p-side electrode are disposed, and a first light emitting element second surface. The second light emitting element has a second light emitting element first surface at which a second n-side electrode and a second p-side electrode are disposed, and a second light emitting element second surface. The first light-transmissive member covers the first light emitting element fourth surface of the first light emitting element and a second light emitting element fourth surface of the second light emitting element. The first wavelength converting member is disposed on the first light-transmissive member.

12 Claims, 10 Drawing Sheets

LIGHT EMITTING DEVICE

CROSS-REFERENCE TO RELATED PATENT APPLICATION

The present application claims priority under 35 U. S. C. § 119 to Japanese Patent Application No. 2019-177033, filed Sep. 27, 2019, the contents of which are hereby incorporated by reference in their entirety.

BACKGROUND

The present disclosure relates to a light emitting device.

Light emitting devices using a plurality of light emitting elements of different peak wavelength to obtain light of desired colors have been developed (for example, see JP 2006-173326A).

SUMMARY

In those light emitting devices, further improvement in mixing colors of light has been required.

It is an object of certain embodiments of the present disclosure to provide a light emitting device that can emit light of uniform color.

The light emitting device according to one embodiment of the present disclosure includes a first layered structure including a first light emitting element and a second light emitting element, a first light-transmissive member, and a first wavelength converting member. The first light emitting element is configured to emit light having a first peak wavelength. The first light emitting element includes a first n-side electrode and a first A-side electrode and has: a first light emitting element first surface at which the first n-side electrode and the first p-side electrode are disposed, a first light emitting element second surface opposite from the first light emitting element first surface, a first light emitting element third surface between the first light emitting element first surface and the first light emitting element second surface, a first light emitting element fourth surface opposite from the first light emitting element third surface, a first light emitting element fifth surface between the first light emitting element first surface and the first light emitting element second surface and between the first light emitting element third surface and the first light emitting element fourth surface, and a first light emitting element sixth surface opposite from the first light emitting element fifth surface. The second light emitting element is configured to emit light having a second peak wavelength that is longer than the first peak wavelength. The second light emitting element includes a second n-side electrode and a second p-side electrode and has: a second light emitting element first surface at which the second n-side electrode and the second p-side electrode are disposed, a second light emitting element second surface opposite from the second light emitting element first surface and facing the first light emitting element second surface, a second light emitting element third surface between the second light emitting element first surface and the second light emitting element second surface, a second light emitting element fourth surface opposite from the second light emitting element third surface, a second light emitting element fifth surface between the second light emitting element first surface and the second light emitting element second surface and between the second light emitting element third surface and the second light emitting element fourth surface, the second light emitting element fifth surface located closer to the first light emitting element fifth surface than to the first light emitting element sixth surface, and a second light emitting element sixth surface opposite from the second light emitting element fifth surface. The first light-transmissive member covers at least a portion of each of the first light emitting element first surface, the first light emitting element fourth surface, the first light emitting element fifth surface, the first light emitting element sixth surface of the first light emitting element and at least a portion of each of the second light emitting element first surface, the second light emitting element fourth surface, the second light emitting element fifth surface, and the second light emitting element sixth surface of the second light emitting element. The first wavelength converting member is disposed on the first light-transmissive member. The first layered structure including the first light emitting element and the second light emitting element, the first light-transmissive member, and the first wavelength converting member are aligned in a first direction. The first light emitting element and the second light emitting element are aligned in a second direction that is orthogonal to the first direction.

Using certain embodiments of the present disclosure allows for realizing a light emitting device with good color mixing.

DETAILED DESCRIPTION

Certain embodiments of the present invention will be described below with reference to the drawings. The drawings referred to in the description below are to schematically illustrate the embodiments, and the size, a space or interval, and locational relationship of the components may be exaggerated, or a portion of a component may not be shown. In the description of the second embodiment and further embodiments, the differences from the first embodiment will be mainly described, and description of features that are the same or similar to those of the first embodiment will be appropriately omitted.

First Embodiment

Figure 1A:
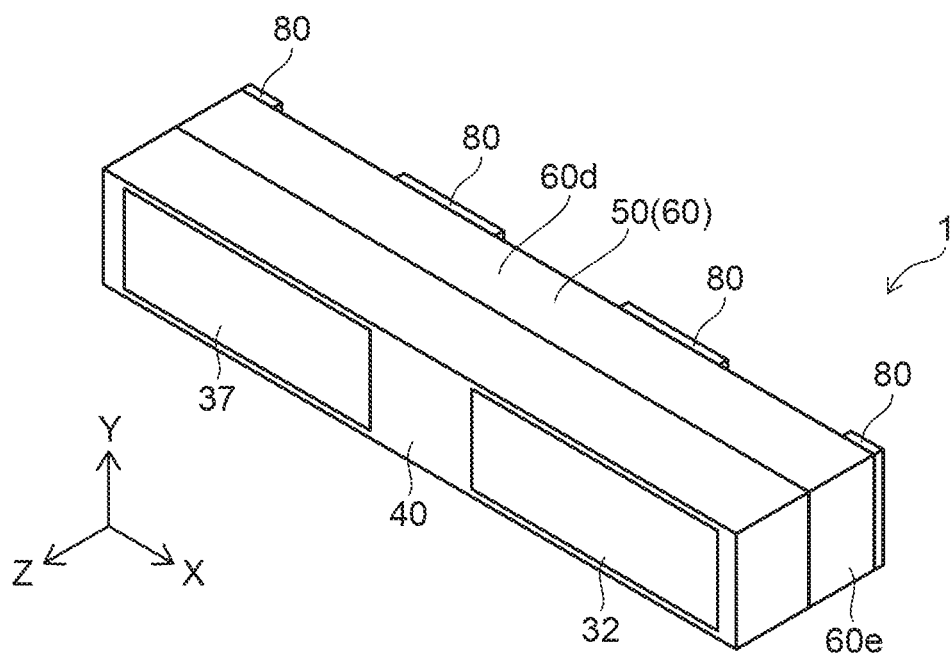
FIG. 1A is a schematic downward perspective view of a light emitting device according to a first embodiment.
Figure 1B:
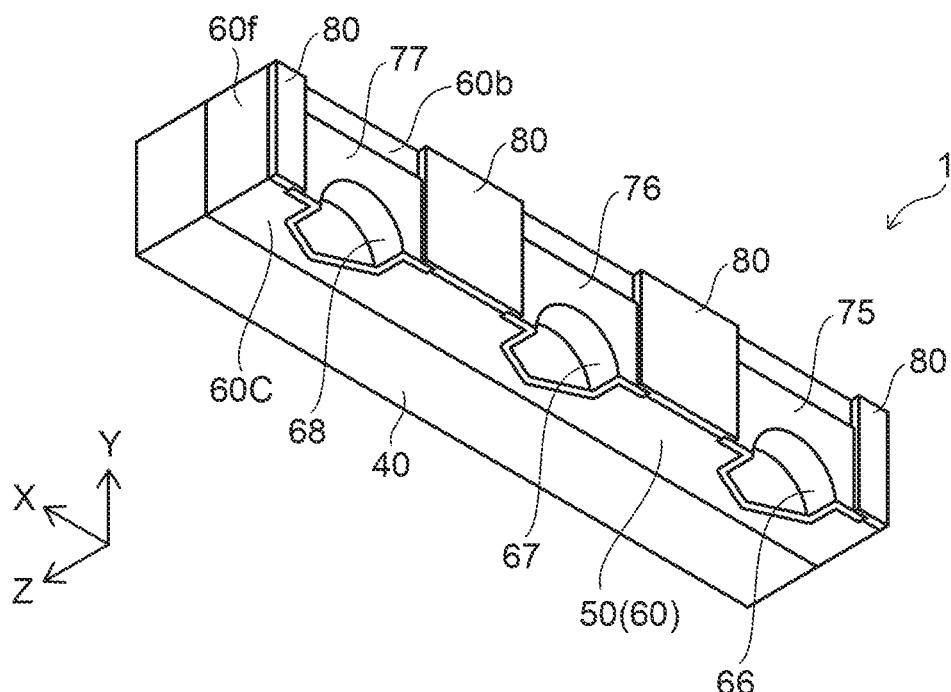
FIG. 1B is a schematic upward perspective view of a light emitting device according to the first embodiment.
Figure 2A:
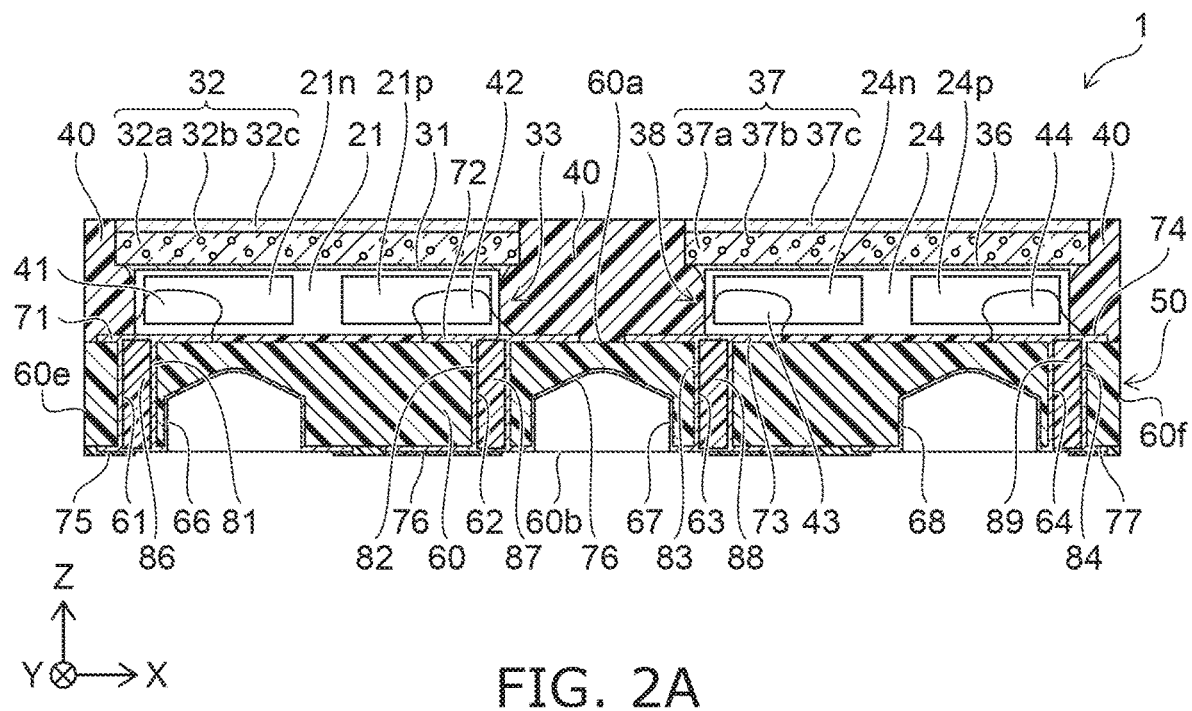
FIG. 2A is a schematic cross-sectional view showing a light emitting device according to the first embodiment.
Figure 2B:
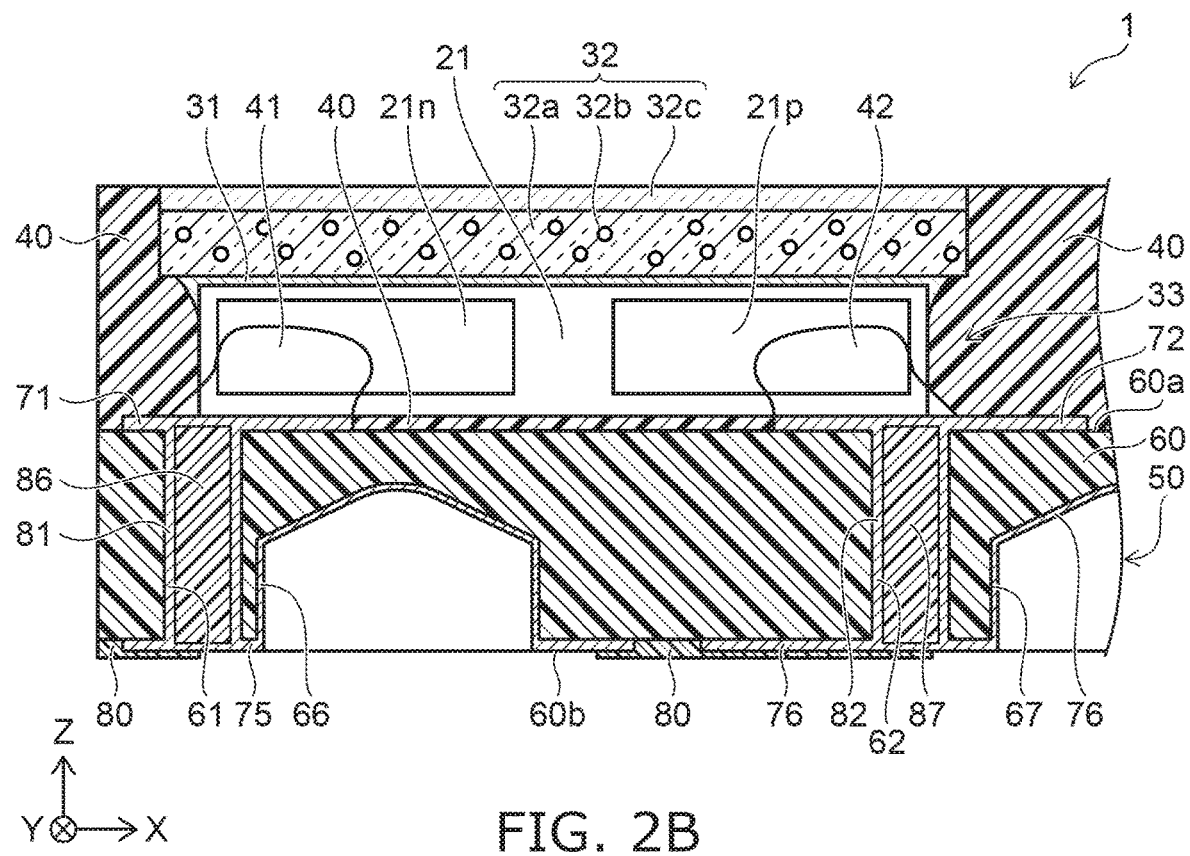
FIG. 2B is a partially enlarged schematic cross-sectional view showing a light emitting device according to the first embodiment.
Figure 3:
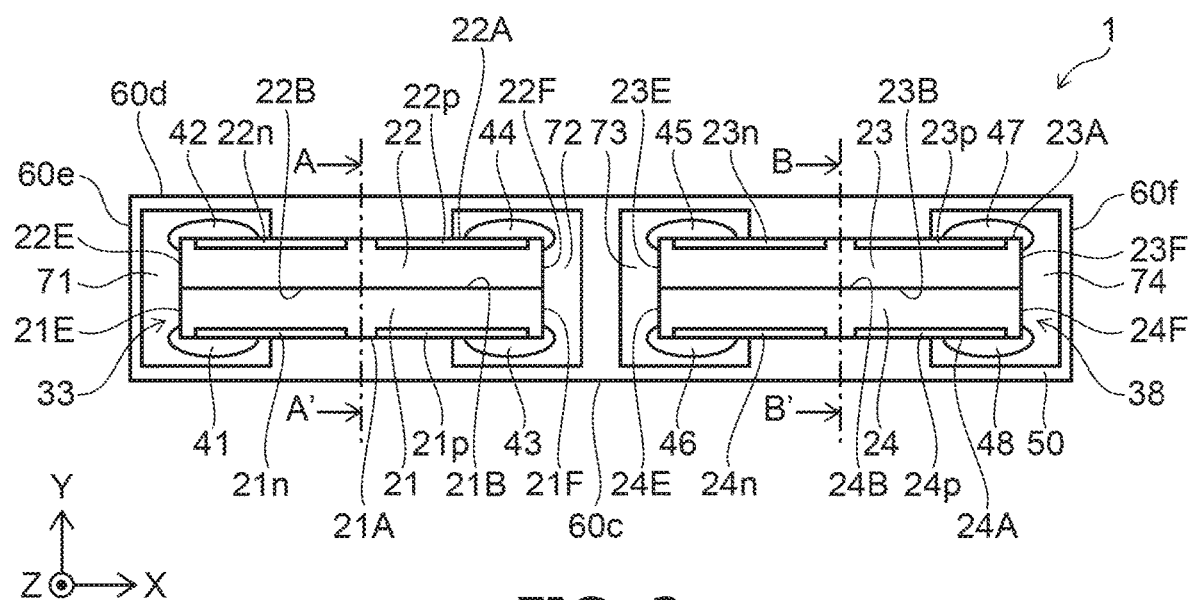
FIG. 3 is a schematic top view showing a light emitting device according to the first embodiment.
Figure 4A:
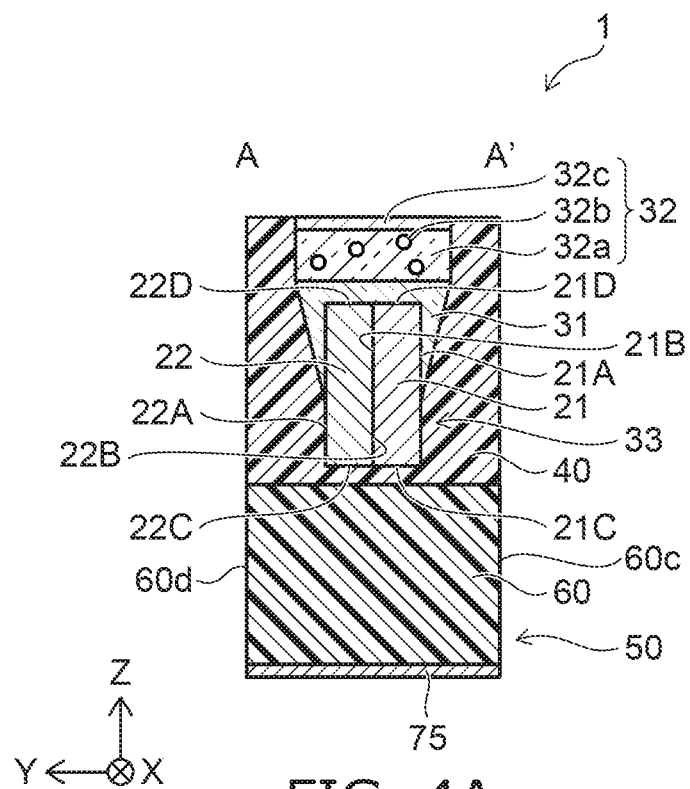
FIG. 4A is a schematic cross-sectional view taken along line A-A' of FIG. 3.
Figure 4B:
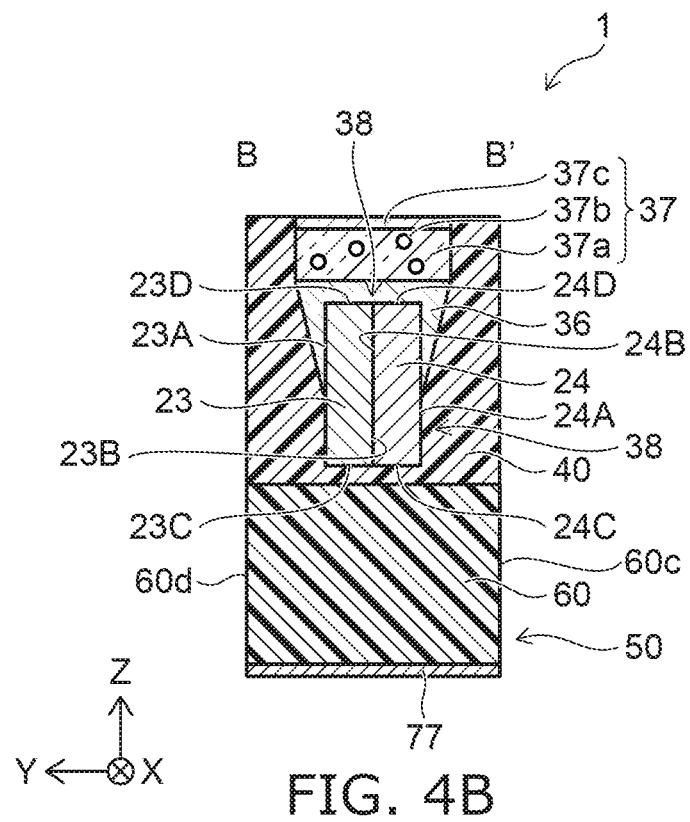
FIG. 4B is a schematic cross-sectional view taken along line B-B' of FIG. 3.

As shown in FIG. 1A to FIG. 4B, the light emitting device 1 according to a first embodiment includes a first light emitting element 21, a second light emitting element 22, a first light-transmissive member 31, and a first wavelength converting member 32. In FIG. 3, the first light-transmissive member 31 and the first wavelength converting member 32 are not shown.

The first light emitting element 21 is configured to emit light with a first peak wavelength 1. The first light emitting element 21 has a first light emitting element first surface 21A at which a first n-side electrode 21n and a first p-side electrode 21p are disposed, a first light emitting element second surface 21B opposite from the first light emitting element first surface 21A, a first light emitting element third surface 21C between the first light emitting element first surface 21A and the first light emitting element second surface 21B, a first light emitting element fourth surface 21D opposite from the first light emitting element third surface 21C, a first light emitting element fifth surface 21E between the first light emitting element first surface 21A and the first light emitting element second surface 21B and between the first light emitting element third surface 21C and the first light emitting element fourth surface 21D, and a first light emitting element sixth surface 21F opposite from the first light emitting element fifth surface 21E.

The second light emitting element 22 is configured second peak wavelength λ2 that is longer than the first peak wavelength 1. The second light emitting element 22 has a second light emitting element first surface 22A at which a second n-side electrode 22n and a second p-side electrode 22p are disposed, a second light emitting element second surface 22B opposite from the second light emitting element first surface 22A and facing the first light emitting element second surface 21B of the first light emitting element 22, a second light emitting element third surface 22C between the second light emitting element first surface 22A and the second light emitting element second surface 22B, a second light emitting element fourth surface 22D opposite from the second light emitting element third surface 22C, a second light emitting element fifth surface 22E between the second light emitting element first surface 22A and the second light emitting element second surface 22B and between the second light emitting element third surface 22C and the second light emitting element fourth surface 22D, and located closer to the first light emitting element fifth surface 21E than to the first light emitting element sixth surface 21F, and a second light emitting element sixth surface 22F opposite from the second light emitting element fifth surface 22E.

A first layered structure 33 is formed of the first light emitting element 21 and the second light emitting element 22. In the first embodiment, the first light emitting element second surface 21B of the first light emitting element 21 and the second light emitting element second surface 22B of the second light emitting element 22 are in contact with each other.

The first light-transmissive member 31 covers an upper portion of the first layered structure 33. The first light-transmissive member 31 covers at least a portion of each of the first light emitting element first surface 21A, the first light emitting element fourth surface 21D, the first light emitting element fifth surface 21E, and the first light emitting element sixth surface 21F of the first light emitting element 21 and at least a portion of each of the second light emitting element first surface 22A, the second light emitting element fourth surface 22D, the second light emitting element fifth surface 22E, and the second light emitting element sixth surface 22F of the second light emitting element 22. The first light-transmissive member 31 has a transmittance to light emitted from the first light emitting element 21 and the second light emitting element 22 greater than a transmittance of a light-reflecting member 40, to be described below, to the light emitted from the first light emitting element 21 and the second light emitting element 22. With the arrangement described above, covering at least a portion of an upper surface and a lateral surface of the first layered structure 33 by the first light-transmissive member 31 can improve a light extraction efficiency of the light emitting device. The first light-transmissive member 31 can be made of a light-transmissive resin material. In the present specification, the term "upper surface of the first layered structure 33" refers to the first light emitting element fourth surface 21D and the second light emitting element fourth surface 22D. Likewise, the term "lateral surfaces of the first layered structure 33" refer to the first light emitting element first surface 21A, the first light emitting element fifth surface 21E, and the first light emitting element sixth surface 21F of the first light emitting element 21 and the second light emitting element first surface 22A, the second light emitting element fifth surface 22E, and the second light emitting element sixth surface 22F of the second light emitting element 22.

The first wavelength converting member 32 is disposed on the first light-transmissive member 31. The first layered structure 33, the first light-transmissive member 31, and the first wavelength converting member 32 are aligned in a first direction Z. The first light emitting element 21 and the second light emitting element 22 are aligned in a second direction Y that is orthogonal to the first direction Z. In the first direction X and the second direction Y, the first wavelength converting member 32 has widths respectively greater than corresponding widths of the first layered structure 33. With this arrangement, light emitted from the first layered structure 33 can be easily guided to the first wavelength converting member 32, which allows an improvement in the light extraction efficiency of the light emitting device.

The light emitting device 1 may further include a third light emitting element 23, a fourth light emitting element 24, a second light-transmissive member 36, and a second wavelength converting member 37. In FIG. 3, the second light-transmissive member 36 and the second wavelength converting member 37 are not shown.

The third light emitting element 23 is configured to emit light with a third peak wavelength $\lambda 3$. The third light emitting element 23 has a third light emitting element first surface 23A at which a third n-side electrode 23n and a third p-side electrode 23p are disposed, a third light emitting element second surface 23B opposite from the third light emitting element first surface 23A, a third light emitting element third surface 23C between the third light emitting element first surface 23A and the third light emitting element second surface 23B, a third light emitting element fourth surface 23D opposite from the third light emitting element third surface 23C, a third light emitting element fifth surface 23E between the third light emitting element first surface 23A and the third light emitting element second surface 23B and between the third light emitting element third surface 23C and the third light emitting element fourth surface 23D and facing the second light emitting element sixth surface 22F of the second light emitting element 22, and a third light emitting element sixth surface 23F opposite from the third light emitting element fifth surface 23E.

The fourth light emitting element 24 is configured to emit light with a fourth peak wavelength $\lambda 4$ that is longer than the third peak wavelength $\lambda 3$. The fourth light emitting element 24 has a fourth light emitting element first surface 24A at which a fourth n-side electrode 24n and a fourth p-side electrode 24p are disposed, a fourth light emitting element second surface 24B opposite from the fourth light emitting element first surface 24A and facing the third light emitting element second surface 23B of the third light emitting element 23, a fourth light emitting element third surface 24C between the fourth light emitting element first surface 24A and the fourth light emitting element second surface 24B, a fourth light emitting element fourth surface 24D opposite from the fourth light emitting element third surface 24C, a fourth light emitting element fifth surface 24E between the fourth light emitting element first surface 24A and the fourth light emitting element second surface 24B and between the fourth light emitting element third surface 24C and the fourth light emitting element fourth surface 24D and facing the first light emitting element sixth surface 21F of the first light emitting element 21, and a fourth light emitting element sixth surface 24F opposite from the fourth light emitting element fifth surface 24E.

A second layered structure 38 is formed of the third light emitting element 23 and the fourth light emitting element 24. In the first embodiment, the third light emitting element second surface 23B of the third light emitting element 23 and the fourth light emitting element second surface 24B of the fourth light emitting element 24 are in contact with each other.

The second light-transmissive member 36 covers an upper portion of the second layered structure 38. The second light-transmissive member 36 covers at least a portion of each of the third light emitting element first surface 23A, the third light emitting element fourth surface 23D, the third light emitting element fifth surface 23E, and the third light emitting element sixth surface 23F of the third light emitting element 23 and at least a portion of each of the fourth light emitting element first surface 24A, the fourth light emitting element fourth surface 24D, the fourth light emitting element fifth surface 24E and the fourth light emitting element sixth surface 24F of the fourth light emitting element 24. With this arrangement, the light extraction efficiency of the light emitting device 1 can be improved. The second light-transmissive member 36 can be made of a light-transmissive resin material.

The second wavelength converting member 37 is disposed on the second light-transmissive member 36. The second layered structure 38, the second light-transmissive member 36, and the second wavelength converting member 37 are aligned in the first direction Z. The fourth light emitting element 24 and the third light emitting element 23 are aligned in the second direction Y. In the first direction X and the second direction Y, the second wavelength converting member 37 has widths respectively greater than corresponding widths of the second layered structure 38.

The first light emitting element 21 and the fourth light emitting element 24 are aligned in a third direction X that is orthogonal to the first direction Z and to the second direction Y The second light emitting element 22 and the third light emitting element 23 are aligned in the third direction X. The first light emitting element 21, the second light emitting element 22, the third light emitting element 23, and the fourth light emitting element 24 respectively have a shape, for example, in a rectangular plate with six outer surfaces as described above, which are substantially flat.

The first light emitting element 21 and the third light emitting element 23 are, for example, light-emitting diodes (LEDs) configured to emit blue light. It is preferable that the first peak wavelength $\lambda 1$ and the third peak wavelength $\lambda 3$ are approximately equal to each other and that more specifically, for example, a difference between the first peak wavelength $\lambda 1$ and the third peak wavelength $\lambda 3$ is within 10 nm. The first peak wavelength $\lambda 1$ and the third peak wavelength $\lambda 3$ are, for example, each in a range of 430 to 490 nm.

The second light emitting element 22 and the fourth light emitting element 24 are, for example, light-emitting diodes (LEDs) configured to emit green light. It is preferable that the second peak wavelength $\lambda 2$ and the fourth peak wavelength $\lambda 4$ are approximately equal to each other and that more specifically, for example, a difference between the second peak wavelength $\lambda 2$ and the fourth peak wavelength $\lambda 4$ is within 10 nm. The second peak wavelength $\lambda 2$ and the fourth peak wavelength $\lambda 4$ are, for example, each in a range of 490 to 570 nm.

The first wavelength converting member 32 includes a first base 32a made of a light-transmissive resin and a plurality of first fluorescent material particles 32b contained in the first base 32a. The first fluorescent material particles 32b can be excited by light emitted from the first light emitting element 21 and emits light with a fifth peak wavelength $\lambda 5$.

The first wavelength converting member 32 may further include a first light-transmissive layer 32c disposed on the first base 32a containing the first fluorescent material particles 32b. The first light-transmissive layer 32c on the first base 32a can serve as a protective layer for the first fluorescent material particles 32b even when the first fluorescent material particles 32b are susceptible to water damage, such that degradation of the first fluorescent material particles 32b can be reduced or prevented. Examples of such a fluorescent material susceptible to water damage include a fluoride-based phosphor activated with manganese. Fluoride-based fluorescent materials activated with manganese can produce an emission with relatively narrow spectral line width and thus preferable in view of color reproductivity. The first light-transmissive layer 32c is made of a light-transmissive resin material, which may not substantially contain the first fluorescent material particles 32b. In the present specification, the expression "substantially does not contain fluorescent material particles" refers to not excluding fluorescent material particles that are inevitably included, more specifically, a content of the fluorescent material particles of 0.05 weight % or less can be referred to as substantially does not contain fluorescent material particles.

The second wavelength converting member 37 includes a second base 37a made of a light-transmissive resin and a plurality of second fluorescent material particles 37b contained in the second base 37a. The second wavelength converting member 37 may further include a second light-transmissive layer 37c disposed on the second base 37a. The second fluorescent material particles 37b can be excited by light emitted from the third light emitting element 23 and emits light with a sixth peak wavelength λ6. The second light-transmissive layer 37c is made of a light-transmissive resin material, which may not substantially contain the second fluorescent material particles 37b.

The fifth peak wavelength λ5 and the sixth peak wavelength λ6 are, for example, each in a range of 610 to 750 nm. It is preferable that the fifth peak wavelength λ5 and the sixth peak wavelength λ6 are approximately equal to each other, for example, a difference between the fifth peak wavelength λ5 and the sixth peak wavelength λ6 is within 10 nm. As described above, the first wavelength converting member 32 and the second wavelength converting member 37 are, for example, configured to absorb blue light and emit red light.

Specific examples of the first and second fluorescent material 32b and 37b that can absorb blue light and emit red light include a nitrogen-containing calcium aluminosilicate (CASN or SCASN)-based fluorescent material (for example (Sr,Ca)AlSiN$_3$:Eu). Specific examples of the first and second fluorescent material 32b and 37b include a fluoride-based phosphor activated with manganese. A fluoride-based fluorescent material activated with manganese can be represented by a formula (I): A$_2$[M$_{1-a}$Mn$_a$F$_6$]. In the formula (I), A represents at least one selected from the group consisting of K, Li, Na, Rb, Cs, and NH$_4$; M represents at least one element selected from the group consisting of Group 4 elements and Group 14 elements; and a satisfies 0<a<0.2. Typical examples of the manganese-activated fluoride-based fluorescent material include manganese-activated potassium fluosilicate-based fluorescent materials (for example K$_2$SiF$_6$:Mn).

With the arrangement described above, the light emitting device 1 as a whole can emit white light that is obtained by mixing, for example, blue light emitted from the first light emitting element 21 and the third light emitting element 23, green light emitted from the second light emitting element 22 and the fourth light emitting element 24, and red light emitted from the first wavelength converting member 32 and the second wavelength converting member 37.

The light emitting device 1 may further include a light-reflecting member 40, a first electrically conductive member 41 to an eighth electrically conductive member 48, and a mounting substrate 50. In FIG. 3, the reflecting member 40 is not shown. The first layered structure 33 and the second layered structure 38 are mounted on a mounting substrate 50. That is, in the first direction Z, the first layered structure 33 is disposed between the mounting substrate 50 and the first wavelength converting member 32 and the second layered structure 38 is disposed between the mounting substrate 50 and the second wavelength converting member 37. The first light-transmissive member 31 and the second light-transmissive member 36 are spaced apart from the mounting substrate 50. The light-reflecting member 40 is disposed on the mounting substrate 50 surrounding lateral surfaces of the first layered structure 33, the first light-transmissive member 31 and the first wavelength converting member 32, and the second layered structure 38, the second light-transmissive member 36, and the second wavelength converting member 37.

The light-reflecting member 40 can be made of an opaque material such as a white resin material. The light-reflecting member 40 covers exposed portions of the upper surface of the mounting substrate 50, exposed portions of the lower surface and lateral surfaces of the first layered structure 33, lateral surfaces of the first light-transmissive member 31, lateral surfaces of the first wavelength converting member 32, exposed portions of the lower surface and lateral surfaces of the second layered structure 38, lateral surfaces of the second light-transmissive member 36, and lateral surfaces of the second wavelength converting member 37. The light-reflecting member 40 does not cover the upper surface of the first wavelength converting member 32 and the upper surface of the second wavelength converting member 37. The light-reflecting member 40 is also disposed between the mounting substrate 50 and the first layered structure 33 and between the mounting substrate 50 and the second layered structure 38.

That is, the light-reflecting member 40 covers at the first light emitting element first surface 21A, the first light emitting element third surface 21C, the first light emitting element fifth surface 21E, and the first light emitting element sixth surface 21F of the first light emitting element 21 and the second light emitting element first surface 22A, the second light emitting element third surface 22C, the second light emitting element fifth surface 22E, and the second light emitting element sixth surface 22F of the second light emitting element 22, the first light-transmissive member 31, and the first wavelength converting member 32. The light-reflecting member 40 also covers the third light emitting element first surface 23A, the third light emitting element third surface 23C, the third light emitting element fifth surface 23E, and the third light emitting element sixth surface 23F of the third light emitting element 23 and the fourth light emitting element first surface 24A, the fourth light emitting element third surface 24C, the fourth light emitting element fifth surface 24E and the fourth light emitting element sixth surface 24F of the fourth light emitting element 24, the second light-transmissive member 36, and the second wavelength converting member 37.

The mounting substrate 50 includes a base member 60. The base member 60 is formed of an electrically insulating material, for example, bismaleimide triazine resin. The base member 60 has a substantially rectangular parallelepiped shape and has external surfaces of an upper surface 60a, a lower surface 60b, a first lateral surface 60c, a second lateral surface 60d, a first end surface 60e, and a second end surface 60f. The upper surface 60a and the lower surface 60b are substantially in parallel to an X-Y plane, the first lateral surface 60c and the second lateral surface 60d are substantially in parallel to an X-Z plane, and the first end surface 60e and the second end surface 60f are substantially in parallel to a Y-Z plane.

The base member 60 is formed with a first through-hole 61, a second through-hole 62, a third through-hole 63, and a fourth through-hole 64, respectively defined by first inner surfaces of the base member 60. The first through-hole 61, the second through-hole 62, the third through-hole 63, and the fourth through-hole 64 are formed aligned in the third direction X. Each of the through-holes extends through the base member 60 in the first direction Z between the upper surface 60a and the lower surface 60b of the base member 60.

The base member 60 is formed with a first recess 66, a second recess 67, a third recess 68, respectively defined by second inner surfaces of the base member 60. The first recess 66, the second recess 67, and the third recess 68 are respectively formed opening to the lower surface 60b and to the first lateral surface 60c. When seen from the second direction Y, the first recess 66 is formed between the first through-hole 61 and the second through-hole 62, the second recess 67 is formed between the second through-hole 62 and the third through-hole 63, and the third recess 68 is formed between the third through-hole 63 and the fourth through-hole 64.

A first wiring 71, a second wiring 72, a third wiring 73, and a fourth wiring 74 are disposed on the upper surface 60a of the base member 60. A fifth wiring 75, a sixth wiring 76, and a seventh wiring 77 are disposed on the lower surface 60b of the base member 60. The fifth wiring 75 is also disposed on the second inner surfaces of the base member 60 defining the first recess 66. The sixth wiring 76 is also disposed on the second inner surfaces of the base member 60 defining the second recess 67. The seventh wiring 77 is also disposed on the second inner surfaces of the base member 60 defining the third recess 68. An electrically insulating layer 80 may be disposed on the regions of the lower surface 60b of the base member 60 where the fifth wiring 75, the sixth wiring 76, and the seventh wiring 77 are not disposed. The electrically insulating layer 80 can be formed with a resist. The electrically insulating layer 80 covers end portions of each of the fifth wiring 75, the sixth wiring 76, and the seventh wiring 77 such that center portions of the wirings are exposed.

The first inner wiring 81 is disposed on the first inner surface of the base member 60 defining the first through-hole 61 and a first electrically insulating member 86 is disposed in the first through hole 61. The second inner wiring 82 is disposed on the first inner surface of the base member 60 defining the second through-hole 62 and a second electrically insulating member 87 is disposed in the second through hole 62. The third inner wiring 83 is disposed on the first inner surface of the base member 60 defining the third through-hole 63 and a third electrically insulating member 88 is disposed in the third through hole 63. The fourth inner wiring 84 is disposed on the first inner surface of the base member 60 defining the fourth through-hole 64 and a fourth electrically insulating member 89 is disposed in the fourth through hole 61. The first electrically insulating member 86, the second electrically insulating member 87, the third electrically insulating member 88, and the fourth electrically insulating member 89 are made of an electrically insulating material such as epoxy resin. In place of the inner wirings and the electrically insulating members, the through holes may be filled with a metal member.

The first wiring 71 is electrically connected to the fifth wiring 75 through the first inner wiring 81 in the first through hole 61. The second wiring 72 is electrically connected to the sixth wiring 76 through the second inner wiring 82 in the second through hole 62. The third wiring 73 is electrically connected to the sixth wiring 76 through the third inner wiring 83 in the third through hole 63. Accordingly, the second wiring 72 and the third wiring 73 are electrically connected to each other through the sixth wiring 76. The fourth wiring 74 is electrically connected to the seventh wiring 77 through the fourth inner wiring 84 in the fourth through hole 64.

The wirings disposed on the upper surface 60a of the base member 60 of the mounting substrate 50 are respectively electrically connected to the corresponding electrodes of the light emitting elements through the electrically conductive members. The first electrically conductive member 41 to the eighth electrically conductive member 48 are, for example, made of a solder material. A solder material known in the art can be used. Examples thereof include a tin-bismuth-based solder material, a tin-copper-based solder material, a tin-silver-based solder material, and a gold-tin-based solder material.

The first wiring 71 is electrically connected to the first n-side electrode 21n of the first light emitting elements 21 through the first electrically conductive member 41. The first wiring 71 is also electrically connected to the second n-side electrode 22n of the second light emitting element 22 through the second electrically conductive member 42. The second wiring 72 is electrically connected to the first p-side electrode 21p of the first light emitting element 21 through the third electrically conductive member 43. The second wiring 72 is also electrically connected to the second p-side electrode 22p of the second light emitting element 22 through the fourth electrically conductive member 44.

The third wiring 73 is electrically connected to the third n-side electrode 23n of the third light emitting element 23 through the fifth electrically conductive member 45. The third wiring 73 is also electrically connected to the first p-side electrode 24n of the fourth light emitting element 24 through the third electrically conductive member 46. Accordingly, the first p-side electrode 21p of the first light emitting element 21 and the second p-side electrode 22p of the second light emitting element 22 are electrically connected to the third n-side electrode 23n of the third light emitting element 23 and the fourth n-side electrode 24n of the fourth light emitting element 24 respectively, through the second wiring 72, the second inner wiring 82, the sixth wiring 76, the third inner wiring 83, and the third wiring 73.

The fourth wiring 74 is electrically connected to the third p-side electrode 23p of the third light emitting element 23 through the seventh electrically conductive member 47. The fourth wiring 74 is also electrically connected to the fourth p-side electrode 24p of the fourth light emitting element 24 through the eighth electrically conductive member 48.

Figure 5:
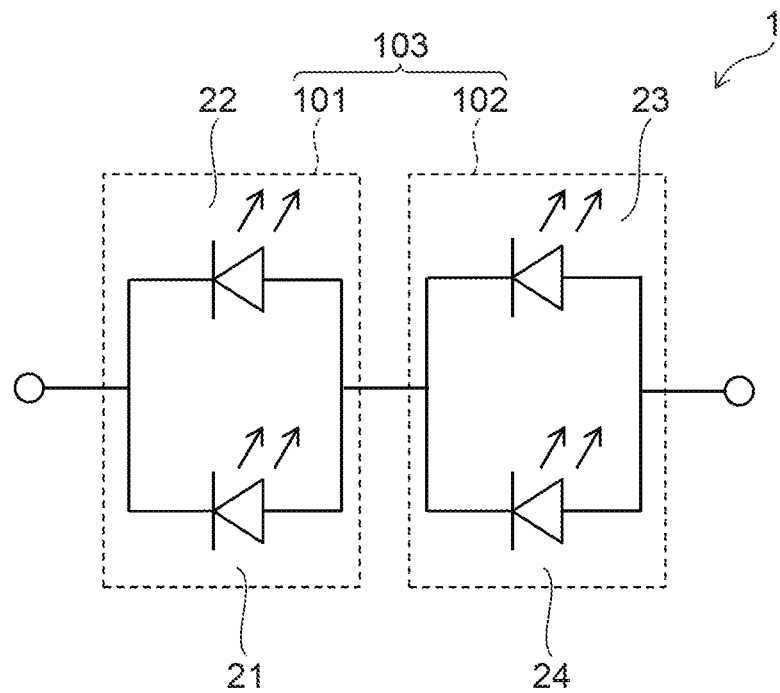
FIG. 5 is a circuit diagram showing a light emitting device according to the first embodiment.

Accordingly in the light emitting device 1, as shown in FIG. 5, a first parallel circuit 101 connecting the first light emitting element 21 and the second light emitting element 22 in parallel, and a second parallel circuit 102 connecting the third light emitting element 23 and the fourth light emitting element 24 in parallel are formed, and further, the first parallel circuit 101 and the second parallel circuit 102 are connected in series to realize a circuit 103.

Next, operation of the light emitting device 1 according to the first embodiment will be described below.

When a DC voltage is supplied between the fifth wiring 75 and the seventh wiring 77, the DC voltage is supplied to the first light emitting element 21, the second light emitting element 22, the third light emitting element 23, and the fourth light emitting element 24. The application of the DC voltage causes the first light emitting element 21 and the third light emitting element 23 to emit, for example, blue light, and the second light emitting element 22 and the fourth light emitting element 24 to emit, for example, green light.

The blue light and the green light enter the first light-transmissive member 31 or the second light-transmissive member 36 and propagate in the first direction Z and also in the second direction Y and are mixed. Then, the lights enter the first wavelength converting member 32 or the second wavelength converting member 37, in which a portion of the blue light is absorbed by the fluorescent material particles 32b or 37b. The first and second fluorescent material particles 32b and 37b emit, for example, red light. Accordingly, light of mixed color of the blue light, the green light, and the red light is emitted from the light emitting device 1.

Next, effects of the first embodiment will be described.

The light emitting device 1 includes the first light emitting element 21 to emit blue light and the second light emitting element 22 to emit green light, thus high color reproductivity is realized. Further, the first light emitting element 21 and the second light emitting element 22 are disposed in contact with each other, which allows facilitating mixing of colors of the lights such that the light emitting device 1 can emit light of satisfactory mixed color.

Further, the light emitting device 1 includes the first light-transmissive member 31 between the first layered structure 33 and the first wavelength converting member 32, where the first layered structure 33 is formed of the first light emitting element 21 and the second light emitting element 22, such that blue light and green light can be mixed in the first light-transmissive member 31. Accordingly, mixing of colors of the lights can be further improved. Likewise, the second light-transmissive member 36 is disposed between the second layered structure 38 and the second wavelength converting member 37, where the second layered structure 38 is formed of the third light emitting element 23 and the fourth light emitting element 24, such that blue light and green light can be mixed in the second light-transmissive member 36. Accordingly, mixing of colors of the lights can be further improved.

Further, the light emitting device 1 includes the first light emitting element 21 and the third light emitting element 23 to emit blue light and the second light emitting element 22 and the fourth light emitting element 24 to emit green light are arranged in a zigzag manner, which allows for a reduction of uneven color in the second direction Y and the third direction X, and thus mixing of colors of the lights can be further improved.

Further, the light emitting device 1 includes the first wavelength converting member 32 having a width greater than a width of the first layered structure 33, and the second wavelength converting member 37 having a width greater than a width of the second layered structure 38, in the second direction Y. With the arrangement described above, light emitted from the first light emitting element 21 and the second light emitting element 22 can be efficiently made incident to the first wavelength converting member 32, and light emitted from the third light emitting element 23 and the fourth light emitting element 24 can be efficiently made incident to the second wavelength converting member 37. Accordingly, a high optical utilization efficiency can be realized in the light emitting device 1.

Second Embodiment

Figure 6:
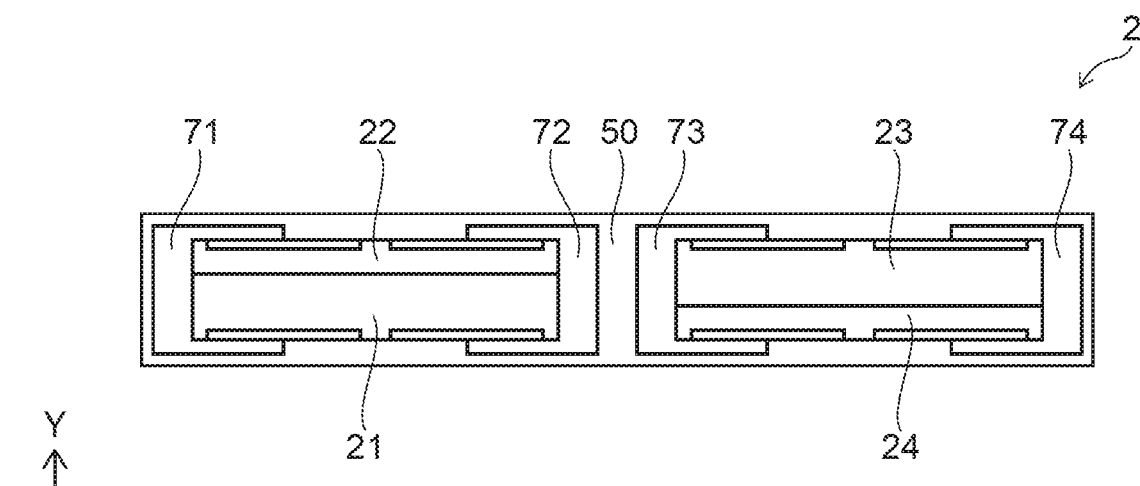
FIG. 6 is a schematic top view showing a light emitting device according to a second embodiment.

FIG. 6 is a schematic top view showing a light emitting device 2 according to a second embodiment. In FIG. 6, a first light-transmissive member 31, a first wavelength converting member 32, a second light-transmissive member 36, a second wavelength converting member 37, a light-reflecting member 40, and a first electrically conductive member 41 to an eighth electrically conductive member 48 are not shown. The above can be applied in a similar manner in FIG. 7 and FIG. 9 to be illustrated below.

As shown in FIG. 6, a light emitting device 2 according to the second embodiment includes a first light emitting element 21 and a second light emitting element 22, the first light emitting element 21 having a width greater than a width of the second light emitting element 22 in the second direction Y. The light emitting device 2 according to the second embodiment includes a third light emitting element 23 and a fourth light emitting element 24, the third light emitting element 23 having a width greater than a width of the fourth light emitting element 24 in the second direction Y.

In the second embodiment, the first light emitting element 21 and the third light emitting element 23 to emit blue light may have volumes greater than volumes of the second light emitting element 22 and the fourth light emitting element 24 to emit green light. Accordingly, intensity of blue light can be increased, such that an amount of blue light absorbed by the first wavelength converting member 32 and the second wavelength converting member 37 can be compensated. Accordingly, light of desired color can be emitted from the light emitting device 2. In the second direction Y, the first light emitting element 21 may have a width smaller than a width of the second light emitting element 22, and the third light emitting element 23 may have a width smaller than a width of the fourth light emitting element 24.

Third Embodiment

Figure 7:
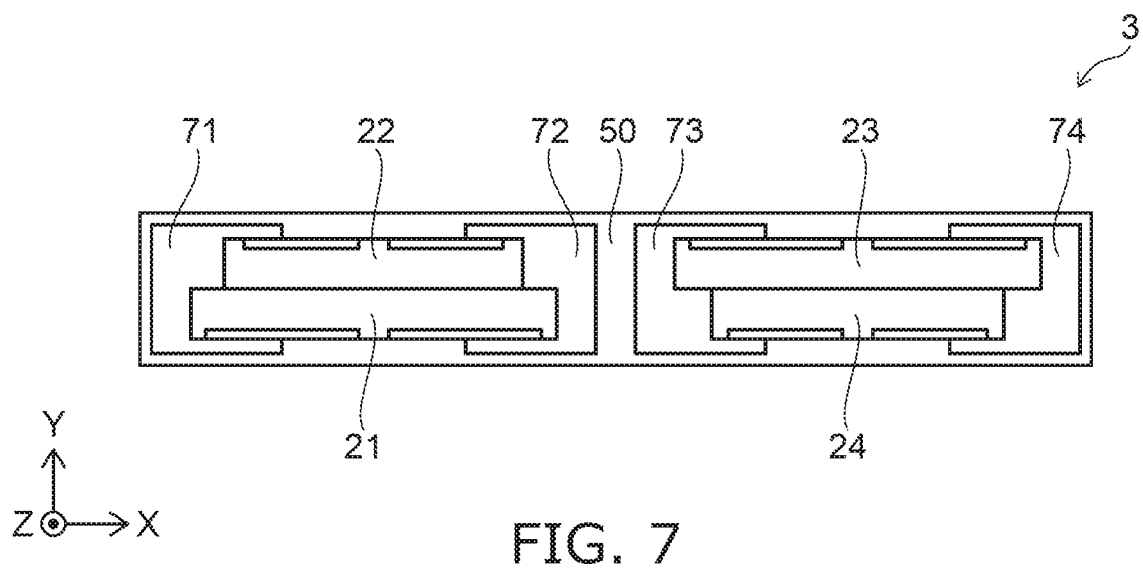
FIG. 7 is a schematic top view showing a light emitting device according to a third embodiment.

FIG. 7 is a schematic top view showing a light emitting device 3 according to a third embodiment. As shown in FIG. 7, the light emitting device 3 according to the third embodiment includes a first light emitting element 21 and a second light emitting element 22, the first light emitting element 21 having a length greater than a length of the second light emitting element 22 in the third direction X. The light emitting device 3 according to the third embodiment also includes a third light emitting element 23 and a fourth light emitting element 24, the third light emitting element 23 has a length greater than a length of the fourth light emitting element 24 in the third direction X.

Similar to in the second embodiment, in the light emitting device 3 of the third embodiment, the first light emitting element 21 and the third light emitting element 23 to emit blue light can have volumes greater than volumes of the second light emitting element 22 and the fourth light emitting element 24 to emit green light. Accordingly, an amount of blue light absorbed by the first wavelength converting member 32 and the second wavelength converting member 37 can be compensated.

When the first light emitting element 21 has a length greater than a length of the second light emitting element 22 in the third direction X, the first light-transmissive member 31 preferably cover a portion of the first light emitting element second surface 21B of the first light emitting element 21. This arrangement facilitates extracting of light emitted from the first light emitting element 21.

Fourth Embodiment

Figure 8:
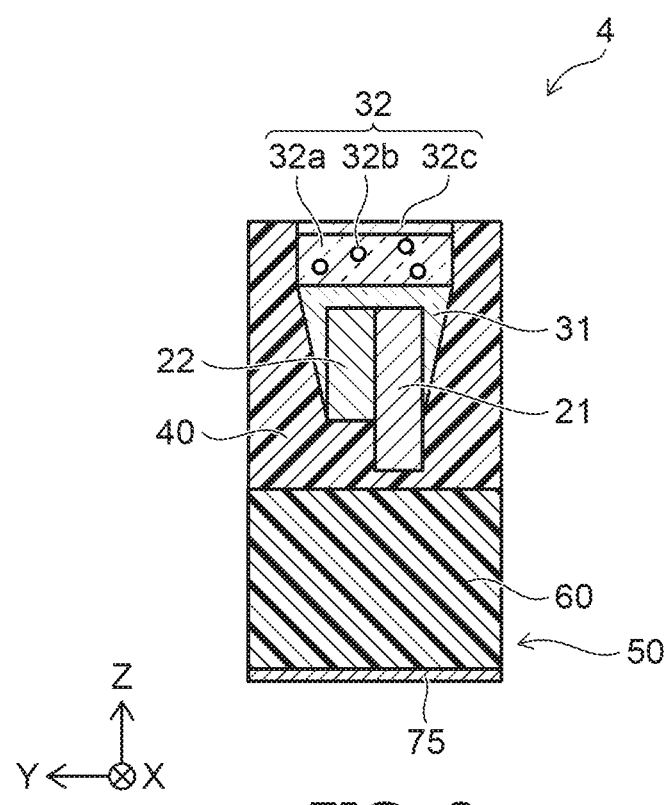
FIG. 8 is a schematic cross-sectional view showing a light emitting device according to a fourth embodiment.

FIG. 8 is a schematic cross-sectional view showing a light emitting device 4 according to a fourth embodiment. As shown in FIG. 8, the light emitting device 4 includes a first light emitting element 21 and a second light emitting element 22, the first light emitting element 21 has a length greater than a length of the second light emitting element 22 in the first direction Z. Also, the third light emitting element 23 has a length greater than a length of the fourth light emitting element 24 in the first direction Z.

Similar to in the second embodiment, in the light emitting device 4 of the fourth embodiment, the first light emitting element 21 and the third light emitting element 23 to emit blue light may have volumes greater than volumes of the second light emitting element 22 and the fourth light emitting element 24 to emit green light.

When the first light emitting element 21 has a length greater than a length of the second light emitting element 22 in the first direction Z, the first light emitting element fourth surface 21D of the first light emitting element 21 and the second light emitting element fourth surface 22D of the second light emitting element 22 may be located in a same plane. With this arrangement, the first light-transmissive member 31 can be easily disposed. When the first light emitting element 21 has a length greater than a length of the second light emitting element 22 in the first direction Z, the first light emitting element third surface 21C of the first light emitting element 21 and the second light emitting element third surface 22C of the second light emitting element 22 may be located in a same plane. This arrangement facilitates the first light-transmissive member 31 covering a portion of the first light emitting element second surface 21B of the first light emitting element 21. This arrangement facilitates extraction of light emitted from the first light emitting element 21.

Fifth Embodiment

Figure 9:
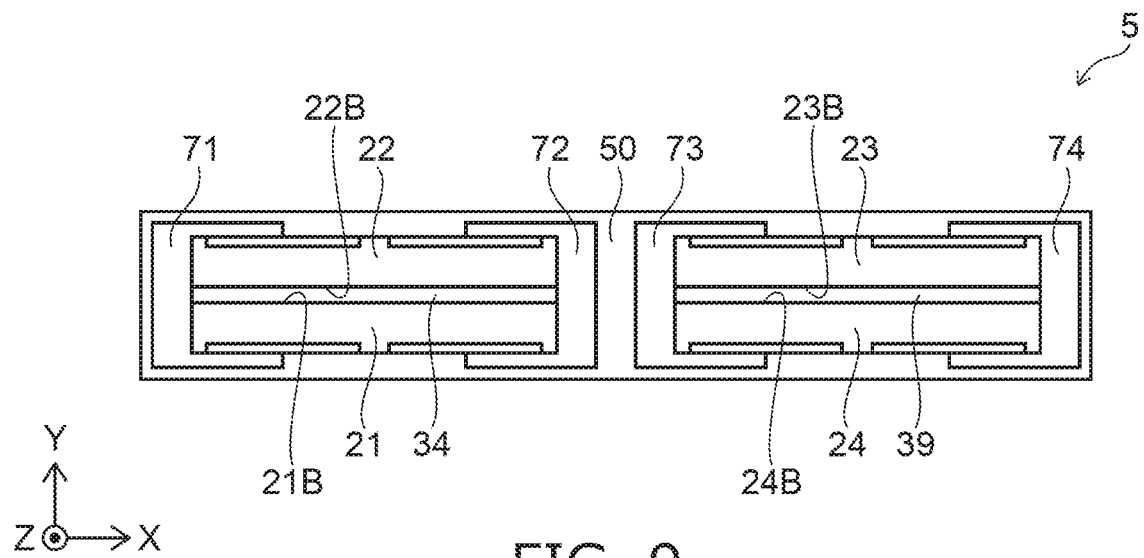
FIG. 9 is a schematic top view showing a light emitting device according to a fifth embodiment.

FIG. 9 is a schematic top view showing a light emitting device 5 according to a fifth embodiment. As shown in FIG. 9, the light emitting device 5 according to the fifth embodiment includes a transparent resin layer 34 between a first light emitting element 21 and a second light emitting element 22. A first light emitting element second surface 21B of the first light emitting element 21 and the second light emitting element second surface 22B of the second light emitting element 22, which are opposite to each other, are bonded through the transparent resin layer 34. Also, the light emitting device 5 includes a transparent resin layer 39 between a third light emitting element 23 and a fourth light emitting element 24, a third light emitting element second surface 23B of the third light emitting element 23 and the fourth light emitting element second surface 24B of the fourth light emitting element 24, which are opposite to each other, are bonded through the transparent resin layer 39.

According to the configuration of the fifth embodiment, the first light emitting element 21 and the second light emitting element 22 can be firmly bonded by the transparent resin layer 34. Likewise, the third light emitting element 23 and the fourth light emitting element 24 can be firmly bonded by the transparent resin layer 39. Accordingly, reliability of the light emitting device 4 can be improved.

The transparent resin layers 34 and 39 may contain a light diffusing material. Mixing color of blue light and green light can also be facilitated by the transparent resin layers 34 and 39. Further, the transparent resin layers 34 and 39 may include fluorescent material particles. The fluorescent material particles contained in the transparent resin layers 34 and 39 can be fluorescent material particles that can absorb blue light and emit red light or fluorescent material particles that can absorb green light and emit red light, for example.

Sixth Embodiment

Figure 10:
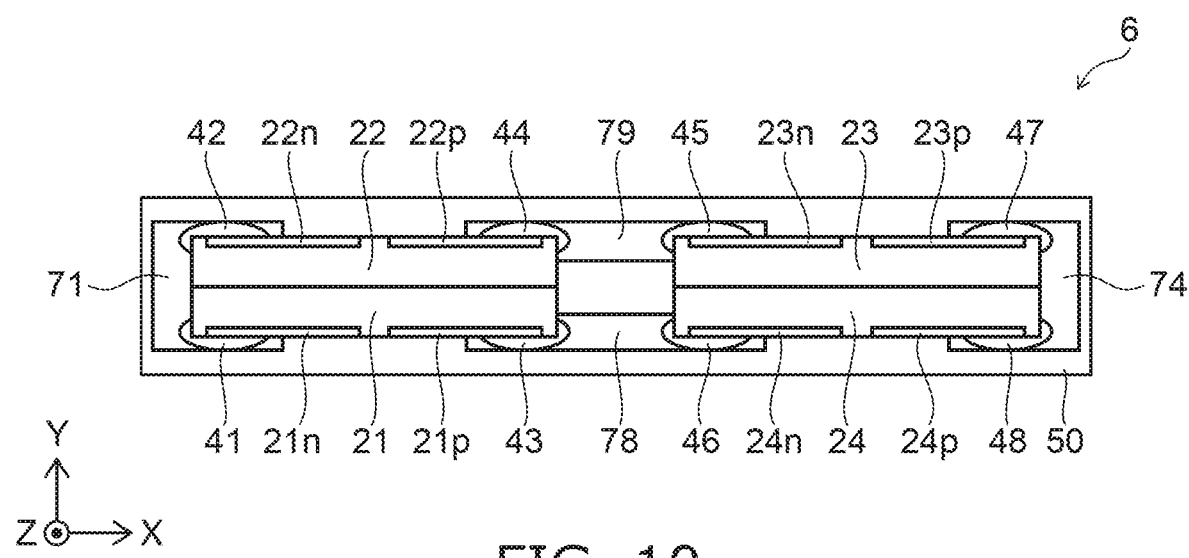
FIG. 10 is a schematic top view showing a light emitting device according to a sixth embodiment.
Figure 11:
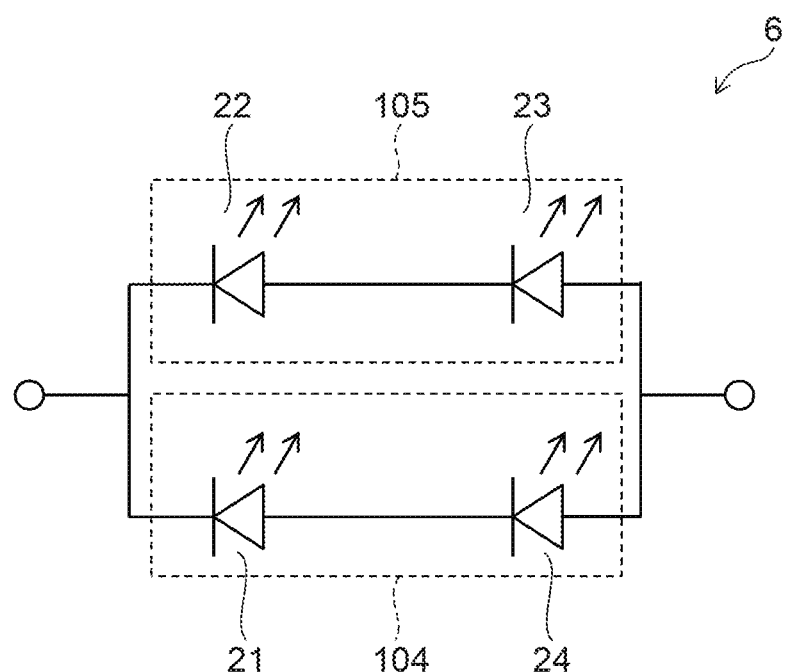
FIG. 11 is a circuit diagram of a light emitting device according to the sixth embodiment.

FIG. 10 is a schematic top view showing a light emitting device 6 according to a sixth embodiment. FIG. 11 is a circuit diagram of a light emitting device 6 according to the sixth embodiment.

As shown in FIG. 10, the light emitting device 6 according to the sixth embodiment includes an eighth wiring 78 and a ninth wiring 79 in place of the second wiring 72 and the third wiring 73 in the light emitting device 1 according to the first embodiment.

The eighth wiring 78 is electrically connected to the first p-side electrode 21p of the first light emitting element 21 through a third electrically conductive member 43. The eighth wiring 78 is also electrically connected to the fourth n-side electrode 24n of the fourth light emitting element 24 through a sixth electrically conductive member 46. The ninth wiring 79 is electrically connected to the second p-side electrode 22p of the second light emitting element 22 through a fourth electrically conductive member 44. The ninth wiring 79 is also electrically connected to the third n-side electrode 23n of the third light emitting element 23 through a fifth electrically conductive member 45. The eighth wiring 78 and the ninth wiring 79 are not connected to each other except through a path connecting the first light emitting element 21, the second light emitting element 23, the third light emitting element 23, and the fourth light emitting element 24.

Accordingly, as shown in FIG. 11, in the light emitting device 6, the first n-side electrode 21n, the first p-side electrode 21p, the fourth n-side electrode 24n, and the fourth p-side electrode 24p are connected in series in this order to form a first series circuit 104. Also, in the light emitting device 6, the second n-side electrode 22n, the second p-side electrode 22p, the third n-side electrode 23n, and the third p-side electrode 23p are connected in series in this order to form a second series circuit 105. The first series circuit 104 and the second series circuit 105 are electrically connected with each other in parallel.

Accordingly, in the light emitting device 6, a difference between a first forward voltage (VF) of the first light emitting element 21 and the third light emitting element 23 to emit blue light and a second forward voltage (VF) of the second light emitting element 22 and the fourth light emitting element 24 to emit green light can be absorbed. As a result, emission of light from each of the light emitting elements can be stabilized.

Seventh Embodiment

Figure 12A:
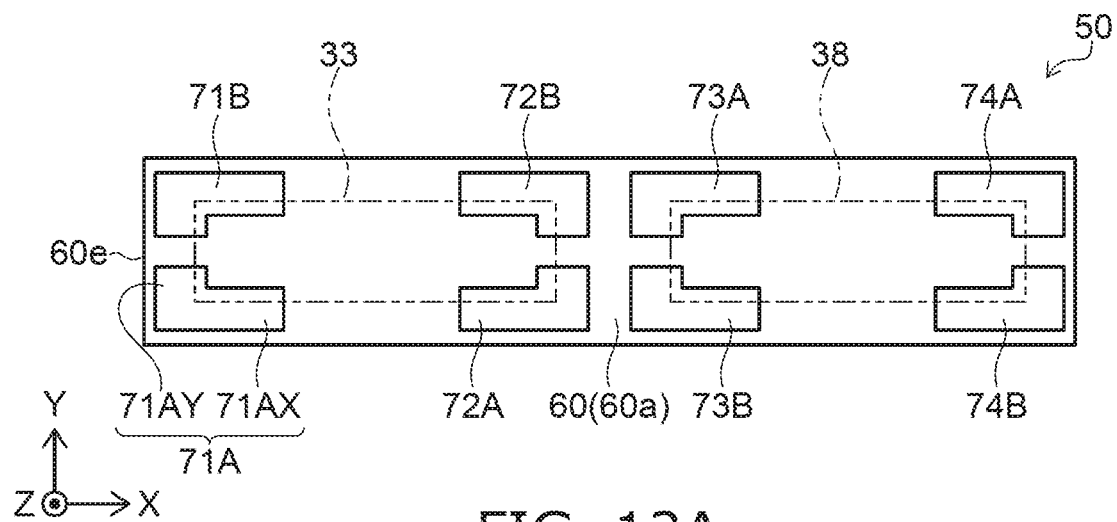
FIG. 12A is a schematic top view showing a mounting substrate of a light emitting device according to a seventh embodiment.
Figure 12B:
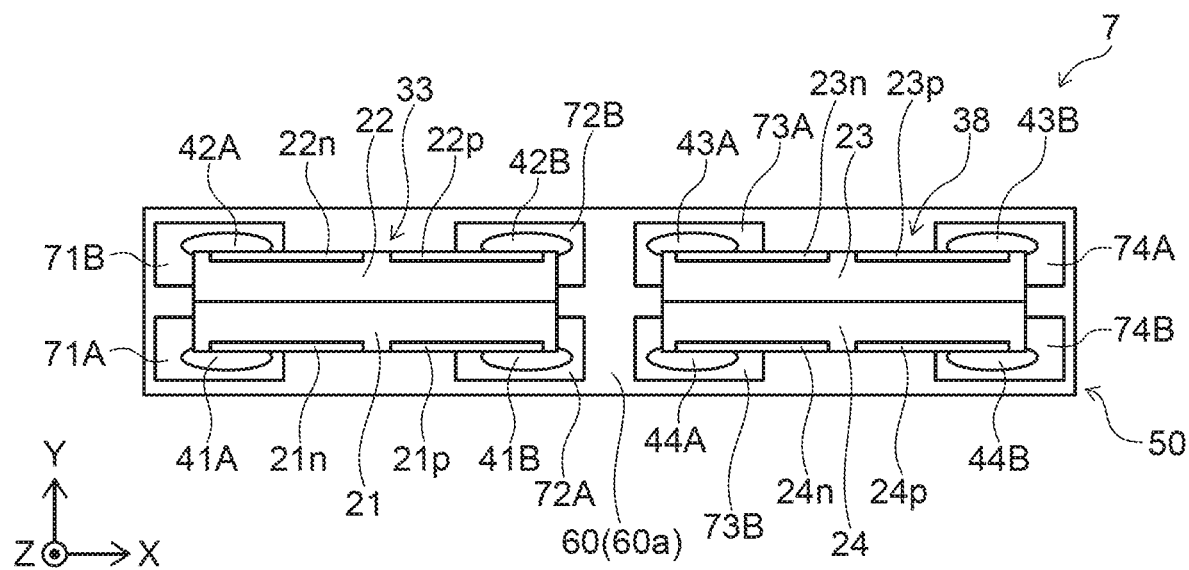
FIG. 12B is a schematic top view showing a light emitting device according to the seventh embodiment.

FIG. 12A is a schematic top view showing a mounting substrate of a light emitting device according to a seventh embodiment. FIG. 12B is a schematic top view showing a light emitting device according to the seventh embodiment.

As shown in FIG. 12A and FIG. 12B, the light emitting device 7 according to the seventh embodiment differs from the light emitting device 1 according to the first embodiment, in which, the upper surface 60a of the base member 60 has eight wirings disposed thereon and the wirings each has an L-shape when viewed from the first direction Z.

That is, the upper surface 60a of the base member 60 of the mounting substrate 50 of the light emitting device 7 is provided with eight wirings: a first first-wiring 71A, a first second-wiring 71B, a second first-wiring 72A, a second second-wiring 72B, a third first-wiring 73A, a third second-wiring 73B, a fourth first-wiring 74A, and a fourth second-wiring 74B.

Each of these wirings has a single X-portion extending in the third direction X and a single Y-portion extending in the second direction Y. For example, the first first-wiring 71A has a first first-X portion 71AX and a first first-Y portion 71AY. The first first-X portion 71AX extends from the first first-Y portion 71AY in the third direction X. In the second direction Y, the first first-Y portion has a width greater than a width of the first first-X portion 71AX. At least a portion of the first first-X portion 71A is covered by the first first-electrically conductive member 41A. Accordingly, the first-first wiring 71A is electrically connected to the first n-side electrode 21n of the first light emitting element 21 through the first first-electrically conductive member 41A.

Configurations similar to the first first-wiring 71A can be applied to the first second-wiring 71B, the second first-wiring 72A, the second second-wiring 72B, the third first-wiring 73A, the third second-wiring 73B, the fourth first-wiring 74A, and the fourth second-wiring 74B. The wirings are disposed to orient respective corresponding corners of the first layered structure 33 and the second layered structure 38.

The first second-wiring 71B is electrically connected to the second n-side electrode 22n of the second light emitting element 22 through a second first-electrically conductive member 42A. The second first-wiring 72A is electrically connected to the first p-side electrode 21p of the first light emitting element 21 through a first second-electrically conductive member 41B. The second second-wiring 72B is electrically connected to the second p-side electrode 22p of the second light emitting element 22 through a second second-electrically conductive member 42B. The third first-wiring 73A is electrically connected to the third n-side electrode 23n of the third light emitting element 23 through a third first-electrically conductive member 43A. The third second-wiring 73B is electrically connected to the fourth n-side electrode 24n of the fourth light emitting element 24 through a fourth first-electrically conductive member 44A. The fourth first-wiring 74A is electrically connected to the third p-side electrode 23p of the third light emitting element 23 through a third second-electrically conductive member 43B. The fourth second-wiring 74B is electrically connected to the fourth p-side electrode 24p of the fourth light emitting element 24 through a fourth second-electrically conductive member 44B.

Further, the mounting substrate 50 may be formed with eight through-holes respectively defined by first inner surfaces of the mounting substrate 50, and respectively electrically connected to the corresponding wirings described above. The wirings described above can be electrically connected with each other in a predetermined manner through respective inner wirings (first inner wiring 81 etc.) disposed on the first inner surfaces defining the through-holes (first through-hole 61 etc.) and wirings (first wiring 75 etc.) disposed on the lower surface 60b of the base member 60. For example, the first first-wiring 71A may be electrically connected to the first second-wiring 71B. The fourth first-wiring 74A may be electrically connected to the fourth second-wiring 74B. The second first-wiring 72A, the second second-wiring 72B, the third first-wiring 73A, and the third second-wiring 73B may be electrically connected with each other to form the circuit shown in FIG. 5. The second first 72A may be electrically connected to the third second-wiring 73B, and the second second-wiring 72B may be electrically connected to the third first-wiring 73A to form the circuit shown in FIG. 11.

In the seventh embodiment, as shown in FIG. 12A, each wiring such as the first first-wiring 71A has an L-shape when viewed from the first direction Z, such that larger portions of the surfaces of the light emitting elements opposite to the mounting substrate 50 (for example, the first light emitting element third surface 21C of the first light emitting element 21) can be covered by the light-reflecting member 40. Accordingly, a high extraction efficiency of the light can be achieved in the light emitting device 7.

When viewed from the first direction Z, the first layered structure 33 may not overlapped with the first first-wiring 71A, the first second-wiring 71B, the second first-wiring 72A, and the second second-wiring 72B, and the second layered structure 38 may not overlapped with the third first-wiring 73A, the third second-wiring 73B, the fourth first-wiring 74A, and the fourth second-wiring 74B.

Accordingly, the first light emitting element third surface 21C of the first light emitting element 21, the second light emitting element third surface 22C of the second light emitting element 22, the third light emitting element third surface 23C of the third light emitting element 23, and the fourth light emitting element third surface 24C of the fourth light emitting element 24 can be entirely covered by the light-reflecting member 40. As a result, most of light emitted from the mounting surface of each of the light emitting elements can be reflected by the light-reflecting member 40, such that the light extracting efficiency of the light emitting device can be further improved.

Further, an alignment mark may be provided on the upper surface 60a of the base member 60. The alignment mark can be formed, for example, in the step of disposing the first first-wiring 71A etc.

Eighth Embodiment

Figure 13A:
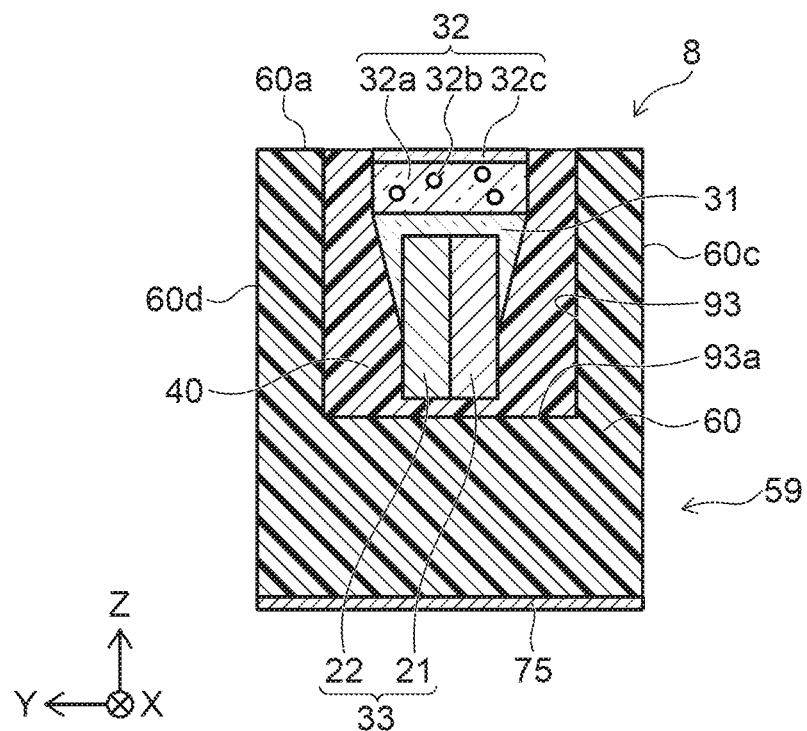
FIG. 13A is a schematic cross-sectional view showing a mounting substrate of a light emitting device according to an eighth embodiment.
Figure 13B:
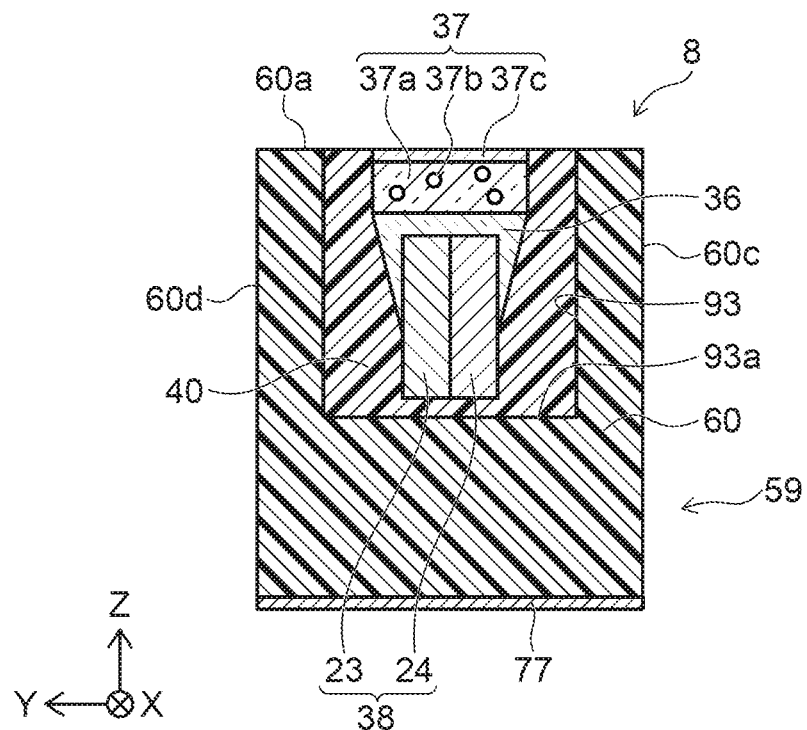
FIG. 13B is a schematic cross-sectional view showing a mounting substrate of a light emitting device according to the eighth embodiment.

FIG. 13A and FIG. 13B are schematic cross-sectional views respectively showing a mounting substrate 59 of a light emitting device 8 according to the eighth embodiment. The cross-sectional views shown in FIG. 13A and FIG. 13B are respectively taken along line A-A' and line B-B' of FIG. 3.

As shown in FIG. 13A and FIG. 13B, the light emitting device 8 according to the eighth embodiment includes a mounting substrate 59. The mounting substrate 59 is formed with a recess 93 defined in an upper surface 60a of the base member 60. That is, the base 60 has a first lateral surface 60c, a second lateral surface 60d, a first end surface 60e, and a second end surface 60f extending further upward than the upward-facing surface 93a of the recess 93.

The first wiring 71, the second wiring 72, the third wiring 73, and the fourth wiring 74 are disposed on the upward-facing surface 93a of the recess 93. Also, the first light emitting element 21, the second light emitting element 22, the third light emitting element 23, the fourth light emitting element 24, the first light-transmissive member 31, the first wavelength converting member 32, the second light-transmissive member 36, and the second wavelength converting member 37 are disposed in the recess 93. The recess 93 is filled with the light-reflecting member 40. An upper surface of the first wavelength converting member 32 and an upper surface of the second wavelength converting member 37 are exposed coplanar with an upper surface of the light-reflecting member 40. Alternative to the light-reflecting member 40, an underfill material may be disposed between the upward-facing surface 93a of the recess 93 and the first layered structure 33 and the upward-facing surface 93a of the recess 93 and the second layered structure 38.

Accommodating the light emitting element, etc., in the recess 93 defined in the base member 60 as in the eighth embodiment allows for improvement in mechanical strength and reliability of the light emitting device 8.

In the embodiments described above, the mounting substrate 50 may be removed after disposing the first layered structure 33, the first light-transmissive member 31, the first wavelength converting member 32, the second layered structure 38, the second light-transmissive member 36, the second wavelength converting member 37, and the light-reflecting member 40 etc. In such a case, after the mounting substrate 50 is removed, a metal film configured to serve as external electrodes may be disposed.

The light emitting device according to the embodiments can be used for a backlight device for liquid crystal display device, various lighting apparatus, a large-sized display device, various display devices for advertising, destination guiding, or the like, a projector device, and further for a digital video camera, an image reading apparatus for a facsimile machine, a copying machine, a scanner, or the like, a projector, and so on.

It is to be understood that, although certain embodiments of the present invention have been described, various other embodiments and variants may occur to those skilled in the art that are within the scope and spirit of the invention, and such other embodiments and variants are intended to be covered by the following claims.

What is claimed is:

1. A light emitting device comprising:
   a first layered structure comprising a first light emitting element configured to emit light having a first peak wavelength and a second light emitting element configured to emit light having a second peak wavelength longer than the first peak wavelength, wherein:
   the first light emitting element comprises a first n-side electrode and a first p-side electrode and has:
      a first light emitting element first surface at which the first n-side electrode and the first p-side electrode are located,
      a first light emitting element second surface opposite the first light emitting element first surface,
      a first light emitting element third surface between the first light emitting element first surface and the first light emitting element second surface,
      a first light emitting element fourth surface opposite the first light emitting element third surface,
      a first light emitting element fifth surface between the first light emitting element first surface and the first light emitting element second surface and between the first light emitting element third surface and the first light emitting element fourth surface, and
      a first light emitting element sixth surface opposite the first light emitting element fifth surface, and
   the second light emitting comprises a second n-side electrode and a second p-side electrode and has:
      a second light emitting element first surface at which the second n-side electrode and the second p-side electrode are located,
      a second light emitting element second surface opposite the second light emitting element first surface and facing the first light emitting element second surface,
      a second light emitting element third surface between the second light emitting element first surface and the second light emitting element second surface,
      a second light emitting element fourth surface opposite the second light emitting element third surface,
      a second light emitting element fifth surface between the second light emitting element first surface and the second light emitting element second surface and between the second light emitting element third surface and the second light emitting element fourth surface, the second light emitting
      fifth surface located closer to the first light emitting element fifth surface than to the first light emitting element sixth surface, and
      a second light emitting element sixth surface opposite the second light emitting element fifth surface;
   a first light-transmissive member covering at least a portion of each of the first light emitting element first surface, the first light emitting element fourth surface, the first light emitting element fifth surface, the first light emitting element sixth surface, the second light emitting element first surface, the second light emitting element fourth surface, the second light emitting element fifth surface, and the second light emitting element sixth surface; and
   a first wavelength converting member on the first light-transmissive member;
   wherein the first layered structure, the first light-transmissive member, and the first wavelength converting member are aligned in a first direction; and
   wherein the first light emitting element and the second light emitting element are aligned in a second direction orthogonal to the first direction.

2. The light emitting device according to claim 1, wherein the first light emitting element second surface and the second light emitting element second surface are in contact with each other.

3. The light emitting device according to claim 1, wherein the first light emitting element second surface is bonded to the second light emitting element second surface via a transparent resin layer.

4. The light emitting device according to claim 1, further comprising:
   a light-reflecting member covering the first light emitting element first surface, the first light emitting element third surface, the first light emitting element fifth surface, the first light emitting element sixth surface, the second light emitting element first surface, the second light emitting element third surface, the second light emitting element fifth surface, and the second light emitting element sixth surface, and covering a portion of the first light-transmissive member and a portion of the first wavelength converting member.

5. The light emitting device according to claim 1, wherein a width of the first light emitting element is greater than a width of the second light emitting element in the second direction.

6. The light emitting device according to claim 1, wherein a width of the first wavelength converting member is greater than a width of the first layered structure in the second direction.

7. The light emitting device according to claim 1, further comprising:
   a mounting substrate,
   wherein the first layered structure is disposed between the mounting substrate and the first wavelength converting member, and the first light-transmissive member is spaced apart from the mounting substrate.

8. The light emitting device according to claim 1, wherein the first peak wavelength is in a range of 430 to 490 nm, and the second peak wavelength is in a range of 490 to 570 nm.

9. The light emitting device according to claim 8, wherein the first wavelength converting member contains particles of a fluorescent material having a peak light-emission wavelength in a range of 610 to 750 nm.

10. The light emitting device according to claim 1, further comprising:

a third light emitting element configured to emit light having a third peak wavelength and a fourth light emitting element configured to emit light having a fourth peak wavelength longer than the third peak wavelength, wherein:
the third light emitting element comprises a third n-side electrode and a third p-side electrode and has:
a third light emitting element first surface at which the third n-side electrode and the third p-side electrode are located,
a third light emitting element second surface opposite the third light emitting element first surface,
a third light emitting element third surface between the third light emitting element first surface and the second surface,
a third light emitting element fourth surface opposite the third light emitting element third surface,
a third light emitting element fifth surface between the third light emitting element first surface and the third light emitting element second surface and between the third light emitting element third surface and the third light emitting element fourth surface, and facing the second light emitting element sixth surface,
a third light emitting element sixth surface opposite the third light emitting element fifth surface; and
the fourth light emitting element comprises a fourth n-side electrode and a fourth p-side electrode and has:
a fourth light emitting element first surface at which the fourth n-side electrode and the fourth p-side electrode are located,
a fourth light emitting element second surface opposite the fourth light emitting element first surface and facing the third light emitting element second surface,
a fourth light emitting element third surface between the fourth light emitting element first surface and the fourth light emitting element second surface,
a fourth light emitting element fourth surface opposite the fourth light emitting element third surface,
a fourth light emitting element fifth surface between the fourth light emitting element first surface and the fourth light emitting element second surface and between the fourth light emitting element third surface and the fourth light emitting element fourth surface, the fourth light emitting element fifth surface facing the first light emitting element sixth surface, and
a fourth light emitting element sixth surface opposite the fourth light emitting element fifth surface;
a second light-transmissive member covering at least a portion of each of the third light emitting element first surface, the third light emitting element fourth surface, the third light emitting element fifth surface, the third light emitting element sixth surface of the third light emitting element and at least a portion of each of the fourth light emitting element first surface, the fourth light emitting element fourth surface, the fourth light emitting element fifth surface, and the fourth light emitting element sixth surface of the fourth light emitting element; and
a second wavelength converting member on the second light-transmissive member.

11. The light emitting device according to claim 10, wherein a difference between the first peak wavelength and the third peak wavelength is 10 nm or less, and a difference between the second peak wavelength and the fourth peak wavelength is 10 nm or less.

12. The light emitting device according to claim 10, wherein the first n-side electrode, the first p-side electrode, the fourth n-side electrode, and the fourth p-side electrode are electrically connected in series in this order to form a first series circuit, the second n-side electrode, the second p-side electrode, the third n-side electrode, and the third p-side electrode are electrically connected in series in this order to form a second series circuit, and the first series circuit and the second series circuit are electrically connected in parallel.

* * * * *